United States Patent
Tanaka et al.

(10) Patent No.: US 7,613,871 B2
(45) Date of Patent: Nov. 3, 2009

(54) STORAGE SYSTEM USING A FLASH MEMORY PARTITIONED WITH WRITE-ONCE AND REWRITABLE BLOCKS

(75) Inventors: Katsuya Tanaka, Kokubunji (JP); Manabu Ishida, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 251 days.

(21) Appl. No.: 11/228,345

(22) Filed: Sep. 19, 2005

(65) Prior Publication Data

US 2006/0288153 A1    Dec. 21, 2006

(30) Foreign Application Priority Data

Jun. 21, 2005  (JP) ............................... 2005-180378

(51) Int. Cl.
  G06F 12/02   (2006.01)
  G06F 12/14   (2006.01)
(52) U.S. Cl. ...................... 711/103; 711/156; 711/163; 711/173
(58) Field of Classification Search ................. 711/103, 711/156, 163, 173
See application file for complete search history.

(56) References Cited

U.S. PATENT DOCUMENTS

| | | | |
|---|---|---|---|
| 5,479,638 A | 12/1995 | Assar et al. | |
| 7,107,389 B2 * | 9/2006 | Inagaki et al. | 711/103 |
| 2003/0070034 A1 * | 4/2003 | Friedman et al. | 711/103 |
| 2006/0069850 A1 * | 3/2006 | Rudelic | 711/103 |
| 2007/0186033 A1 * | 8/2007 | Shinagawa et al. | 711/103 |

FOREIGN PATENT DOCUMENTS

| | | |
|---|---|---|
| JP | 05-027924 | 2/1996 |
| WO | WO 2005/031754 A1 | 4/2005 |

* cited by examiner

Primary Examiner—Shane M Thomas
(74) Attorney, Agent, or Firm—Brundidge & Stanger, P.C.

(57) ABSTRACT

Provided is a storage system including: a nonvolatile memory which stores and erases data for respective blocks; and a controller for inputting and outputting the data to and from the nonvolatile memory, wherein: the storage system has a storage area including: a rewritable area where a stored data can be erased; and a write-once area where the stored data cannot be erased; and the controller determines a block belonging to the rewritable area based on an attribute of the block, and performs a wear leveling process and a reclamation process only on the block determined as belonging to the rewritable area.

10 Claims, 14 Drawing Sheets

STORAGE ADAPTER

| PHYSICAL ADDRESS (601) | LOGICAL ADDRESS (602) | STATUS (603) |
|---|---|---|
|  |  |  |
|  |  |  |
|  |  |  |
|  |  |  |
|  |  |  |
|  |  |  |
|  |  |  |
|  |  |  |

PAGE MANAGEMENT TABLE (600)

FIG.6

| PHYSICAL BLOCK NUMBER /705 | LOGICAL BLOCK NUMBER /701 | WRITE CONTROL INFORMATION /702 | UNUSED PAGE COUNT /703 | ERASING COUNT /704 |
|---|---|---|---|---|
| | | | | |
| | | | | |
| | | | | |
| | | | | |
| | | | | |
| | | | | |
| | | | | |

700

BLOCK MANAGEMENT TABLE

FIG.7

STORAGE SYSTEM USING A FLASH MEMORY PARTITIONED WITH WRITE-ONCE AND REWRITABLE BLOCKS

CLAIM OF PRIORITY

The present application claims priority from Japanese patent application P2005-180378 filed on Jun. 21, 2005, the content of which is hereby incorporated by reference into this application.

BACKGROUND

This invention relates to a storage system for storing data, and more particularly to a technique that uses a nonvolatile semiconductor memory capable of erasing data each block, as a storage medium.

In recent years, a storage system for storing data safely for a long time has been required. For example, it is required by law that a financial institution, a medical institution, and the like have their document data stored in a write-once memory in which data cannot be erased or rewritten.

The storage system generally has a random-accessible nonvolatile storage medium. Examples of the random-accessible nonvolatile storage medium include a magnetic disk and an optical disk. Also, the storage system that is currently in the mainstream has a large number of small disk drives.

Also, with the advancement of a semiconductor technology, a flash erasable nonvolatile semiconductor memory has been developed. An example of the flash erasable nonvolatile semiconductor memory includes a flash memory. The storage system that uses the flash memory as the storage medium is superior to the storage system, which has a large number of the small disk drives, in terms of useful life, electric power saving, access time and the like.

Here, the flash memory will be explained. In the flash memory, according to its features, the data cannot be directly rewritten. In other words, in the flash memory, the stored valid data must be saved to rewrite the stored data. Next, the stored data is erased by the block. Then, the data is written to the block where the data is erased. It should be noted that the block is a storage area as unit by which the data is flash-erased.

Specifically, in the flash memory, '1' can be rewritten to '0'. However, '0' cannot be rewritten to '1'. So, in the flash memory, the entire block is erased to rewrite the data.

In the flash memory, it takes longer time to write and erase the data than to read the data. For this reason, in the flash memory, in order to rewrite the data, the data must be erased and written continuously. Thus, the operation becomes desperately slow.

A storage system for solving those problems is disclosed in JP 05-27924 A. The storage system of the prior art introduces an address control method of giving flexibility to an address relation between a host CPU and an external memory so that a physical address of the semiconductor memory is not unilaterally determined by a logical address possessed by a command of the host CPU.

SUMMARY

In this storage system of the prior art, the execution of a reclamation (or "garbage collection") process or wear leveling process results in the movement of the data between the blocks. Thus, in the storage system, when a trouble of an erroneous operation, a power failure or the like occurs during the movement of data, there is a fear that the data is lost.

Also, in the storage system of the prior art, the data is erased by merely setting an invalid flag for a physical block where the data is stored. In other words, the data actually remains in the storage system without being erased, so there is a possibility that the erased data is read. Thus, the storage system cannot be safe in terms of information leakage prevention.

Also, the storage system of the prior art does not consider the area assignment of a write-once area and a rewritable area. Thus, the storage system cannot store the data that is obliged to be stored in the write-once area, when the write-once area runs out of capacity.

Moreover, the storage system of the prior art does not consider the retention date of the data. Thus, the storage system does not erase the data existing beyond the retention date. As a result, the storage system permanently stores the unnecessary data.

This invention is proposed in view of the above-mentioned problems. It is therefore an object of this invention to provide a storage system for preventing a loss of data stored in a write-once area.

According to an embodiment of this invention, there is provided a storage system including: a nonvolatile memory used as a storage medium, which erases data for each block; and a controller for inputting and outputting the data to and from the nonvolatile memory. The storage system has a storage area including: a rewritable area where a stored data can be erased; and a write-once area where the stored data cannot be erased. The controller determines the block belonging to the rewritable area, in accordance with an attribute of the block. The controller performs the wear leveling process and the reclamation process only on the block determined as belonging to the rewritable area.

According to the embodiment of this invention, it is possible to prevent the loss of the data stored in the write-once area.

BRIEF DESCRIPTION OF THE DRAWINGS

The present invention can be appreciated by the description which follows in conjunction with the following figures, wherein:

FIG. 6 shows a configuration of a page management table stored in a memory of the flash memory module of the first embodiment;

FIG. 7 shows a configuration of a block management table stored in the memory of the flash memory module of the first embodiment;

DESCRIPTION OF THE PREFERRED EMBODIMENTS

Embodiments of this invention will be described below with reference to the drawings.

First Embodiment

Figure 1:
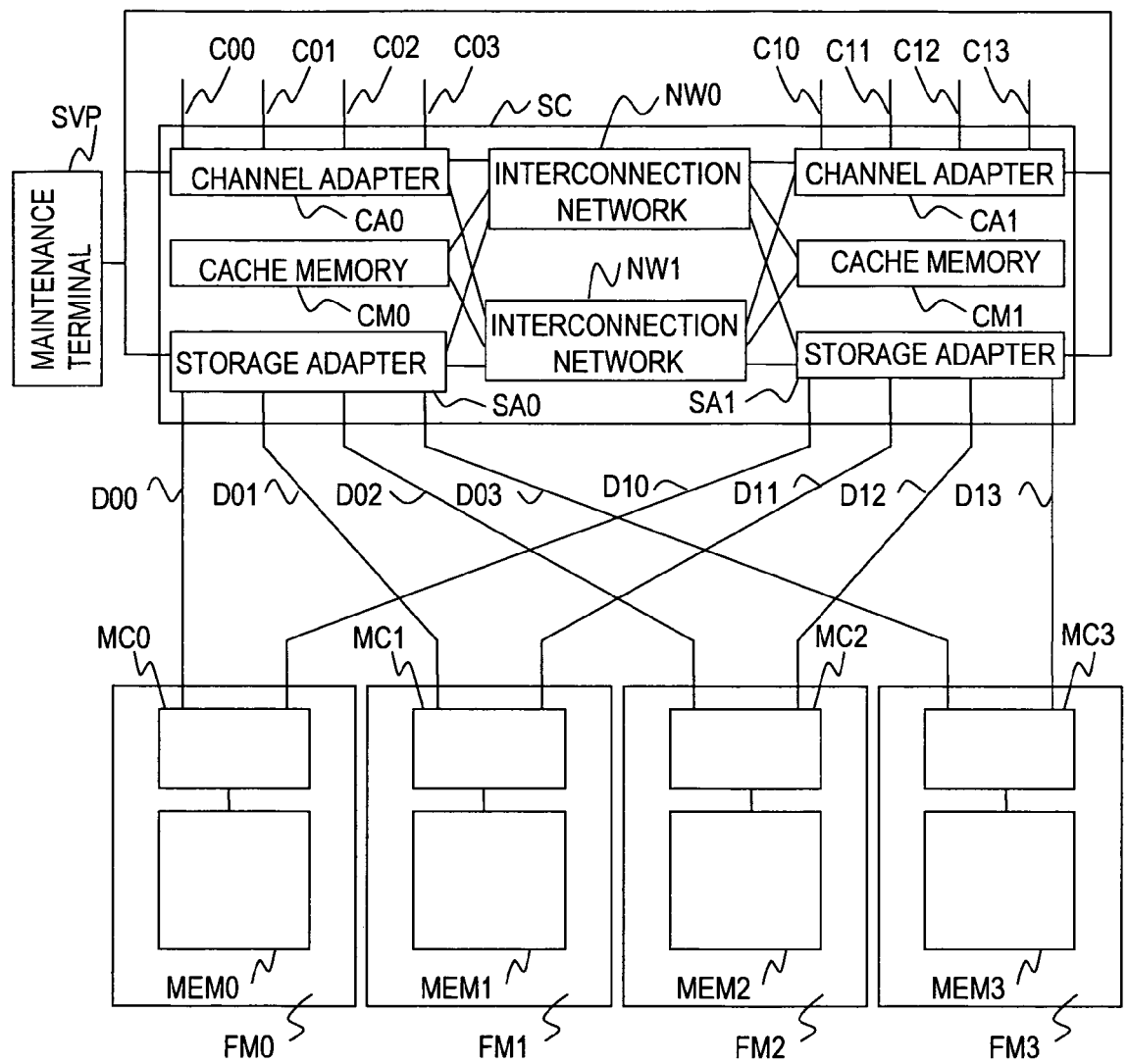
FIG. 1 is a block diagram of a storage system of a first embodiment.

FIG. 1 is a block diagram of a storage system of a first embodiment.

The storage system has a storage controller SC and flash memory modules FM0, FM1, FM2 and FM3.

The storage controller SC has channel adapters CA0, CA1, cache memories CM0, CM1, storage adapters SA0, SA1 and interconnection networks NW0, NW1.

It should be noted that, in FIG. 1, the numbers of the channel adapters CA0, CA1, of the cache memories CM0, CM1, and of the storage adapters SA0, SA1 are each set as two. However, the numbers of them may be arbitrary.

The interconnection networks NW0, NW1 are, for example, switches, and connect the devices constituting the storage controller SC to one another. Specifically, the interconnection networks NW0, NW1 connect the channel adapter CA0, the cache memory CM0 and the storage adapter SA0 to one another. Similarly, the interconnection networks NW0, NW1 connect the channel adapter CA1, the cache memory CM1 and the storage adapter SA1 to one another.

Figure 2:
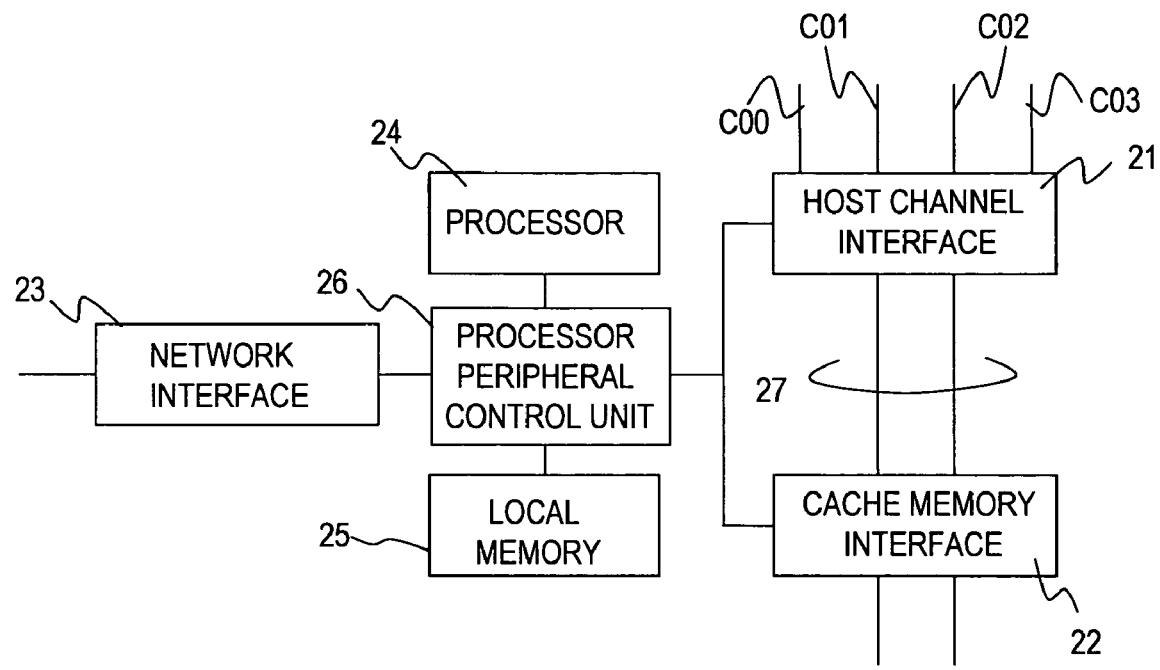
FIG. 2 is a block diagram of a channel adapter of the first embodiment.

The channel adapter CA0 as will be described later in FIG. 2, is connected through channels C00, C01, C02 and C03 to external host systems (not shown). Similarly, the channel adapter CA1 is connected through channels C10, C11, C12 and C13 to external host systems (not shown). The host systems are the computers for reading and writing data from and to the storage system in this embodiment.

The cache memory CM0 transiently stores the data received from the channel adapter CA0 and the storage adapter SA0. Similarly, the cache memory CM1 transiently stores the data received from the channel adapter CA1 and the storage adapter SA1.

Figure 3:
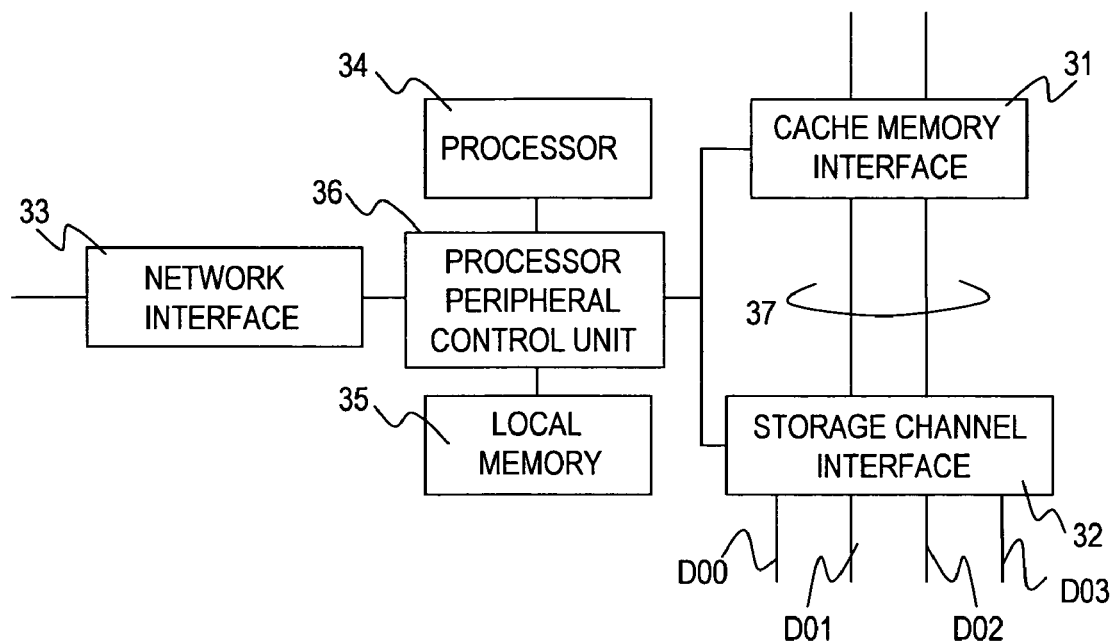
FIG. 3 is a block diagram of a storage adapter of the first embodiment.

The storage adapter SA0, as will be described in FIG. 3, is connected to the flash memory module FM0 and the like. Specifically, the storage adapter SA0 is connected through a channel D00 to the flash memory module FM0. The storage adapter SA0 is connected through a channel D01 to the flash memory module FM1. The storage adapter SA0 is connected through a channel D02 to the flash memory module FM2. Also, the storage adapter SA0 is connected through a channel D03 to the flash memory module FM3.

Similarly, the storage adapter SA1 is connected to the flash memory module FM0 and the like. Specifically, the storage adapter SA1 is connected through a channel D10 to the flash memory module FM0. The storage adapter SA1 is connected through a channel D11 to the flash memory module FM1. The storage adapter SA1 is connected through a channel D12 to the flash memory module FM2. Also, the storage adapter SA1 is connected through a channel D13 to the flash memory module FM3.

The channel adapters CA0, CA1 and the storage adapters SA0, SA1 are connected to a maintenance terminal SVP. The maintenance terminal SVP transmits the setting information inputted by an administrator of the storage system to the channel adapters CA0, CA1 and/or the storage adapters SA0, SA1.

The flash memory module FM0, as will be described later in FIG. 4, has a memory controller MC0 and a flash memory MEM0. Similarly, the flash memory module FM1 has a memory controller MC1 and a flash memory MEM1. The flash memory module FM2 has a memory controller MC2 and a flash memory MEM2. Also, the flash memory module FM3 has a memory controller MC3 and a flash memory MEM3.

The flash memories MEM0, MEM1, MEM2 and MEM3 store data. The memory controllers MC0, MC1, MC2 and MC3 read and write the data from and to the flash memories MEM0, MEM1, MEM2 and MEM3.

It should be noted that the storage system may have a single adapter, instead of both the storage adapter SA0 and the channel adapter CA0. In this case, the adapter carries out the processes of the storage adapter SA0 and the channel adapter CA0.

FIG. 2 is a block diagram of the channel adapter CA0 of the first embodiment.

The channel adapter CA0 has a host channel interface 21, a cache memory interface 22, a network interface 23, a processor 24, a local memory 25 and a processor peripheral control unit 26.

The host channel interface 21 is the interface connected through the channels C00, C01, C02 and C03 to the external host systems (not shown). Also, the host channel interface 21 converts a data transfer protocol on each of the channels C00, C01, C02 and C03 to a data transfer protocol inside the storage controller SC, and vice versa.

The cache memory interface 22 is the interface connected to the interconnection networks NW0, NW1. The network interface 23 is the interface connected to the maintenance terminal SVP.

The host channel interface 21 and the cache memory interface 22 are connected through a signal line 27.

The processor 24 carries out the various processes by executing the program stored in the local memory 25. Specifically, the processor 24 controls the data transfer between the host systems and the interconnection networks NW0, NW1.

The local memory 25 stores the program executed by the processor 24. Also, the local memory 25 stores a table which the processor 24 refers to. The table is set or changed by an administrator.

In this case, the administrator inputs the information with regard to the setting of the table or the change of the table to the maintenance terminal SVP. The maintenance terminal SVP transmits the input information through the network interface 23 to the processor 24. The processor 24 creates or changes the table, based on the received information. Then, the processor 24 stores the table in the local memory 25.

The processor peripheral control unit 26 controls the transmission/reception among the host channel interface 21, the cache memory interface 22, the network interface 23, the processor 24 and the local memory 25. An example of the processor peripheral control unit 26 includes a chip set.

The channel adapter CA1 has the same configuration as the channel adapter CA0. Thus, an explanation for the channel adopter CA1 is omitted.

FIG. 3 is a block diagram of the storage adapter SA0 of the first embodiment.

The storage adapter SA0 has a cache memory interface 31, a storage channel interface 32, a network interface 33, a processor 34, a local memory 35 and a processor peripheral control unit 36.

The cache memory interface 31 is the interface connected to the interconnection networks NW0, NW1.

The storage channel interface 32 is the interface connected to the channels D00, D01, D02 and D03. Also, the storage channel interface 32 converts a data transfer protocol on each of the channels D00, D01, D02 and D03 to a data transfer protocol inside the storage controller SC, and vice versa.

The cache memory interface 31 and the storage channel interface 32 are connected through a signal line 37.

The network interface 33 is the interface connected to the maintenance terminal SVP.

The processor 34 carries out the various processes by executing the program stored in the local memory 35.

The local memory 35 stores the program executed by the processor 34. Also, the local memory 35 stores a table which the processor 34 refers to. The table is set or changed by an administrator.

In this case, the administrator inputs the information with regard to the setting of the table or the change of the table to the maintenance terminal SVP. The maintenance terminal SVP transmits the input information through the network interface 33 to the processor 34. The processor 34 creates or changes the table based on the received information. Then, the processor 34 stores the table in the local memory 35.

The processor peripheral control unit 36 controls the transmission/reception among the cache memory interface 31, the storage channel interface 32, the network interface 33, the processor 34 and the local memory 35. An example of the processor peripheral control unit 36 includes a chip set.

The storage adapter SA1 has the same configuration as the storage adapter SA0. Thus, an explanation for the storage adapter SA1 is omitted.

Figure 4:
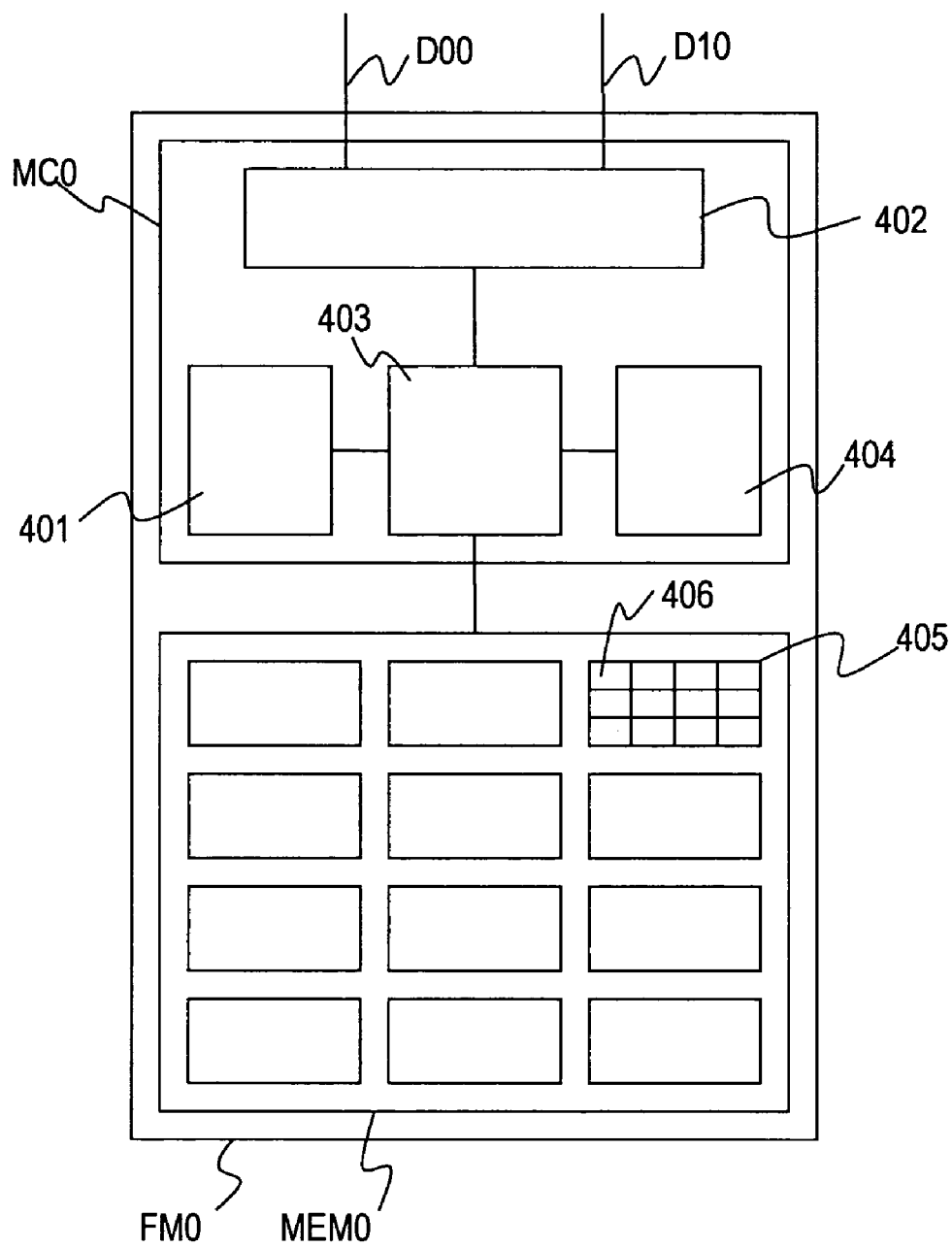
FIG. 4 is a block diagram of a flash memory module of the first embodiment.

FIG. 4 is a block diagram of the flash memory module FM0 of the first embodiment.

The flash memory module FM0 has the memory controller MC0 and the flash memory MEM0.

The memory controller MC0 has a processor 401, an interface section 402, a data transfer section 403 and a memory 404.

Figure 5:
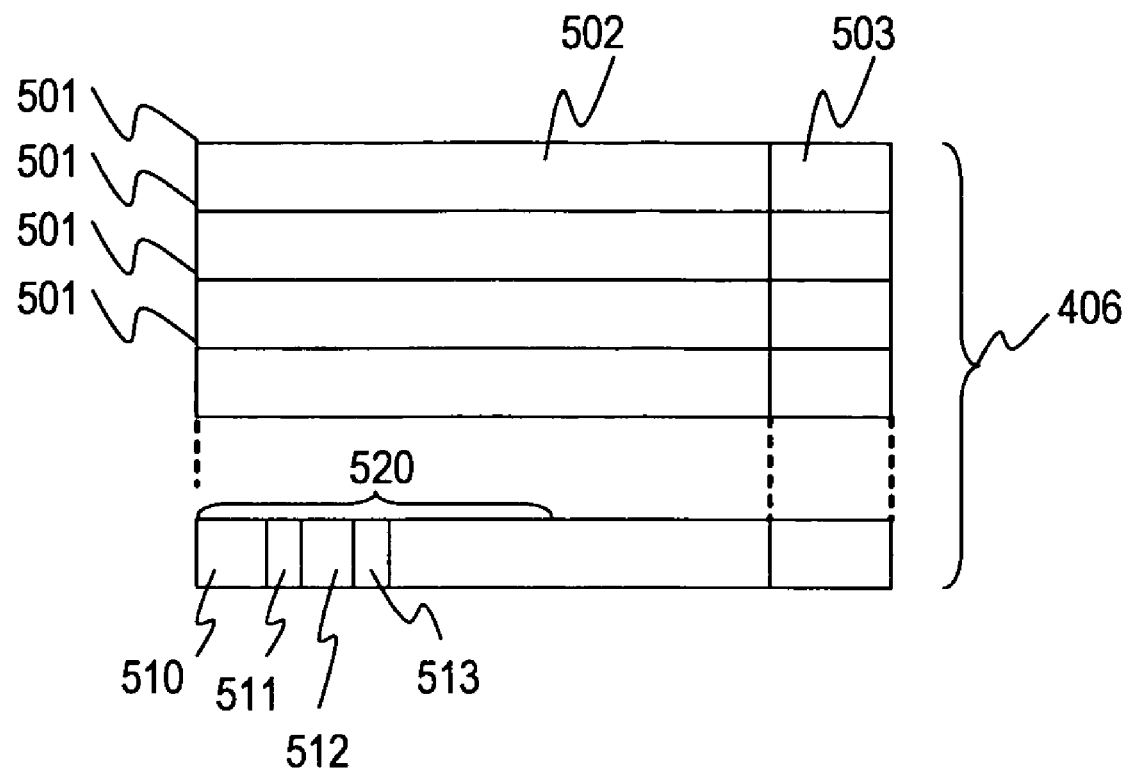
FIG. 5 is an illustration of a block of the flash memory module of the first embodiment.

The flash memory MEM0 has a plurality of flash memory chips 405. The flash memory chips 405 each have a plurality of blocks 406 and stores the data. The block 406, as will be described later in FIG. 5, is the unit at which the memory controller MC0 erases the data.

The block 406 is classified into one of a valid block or a bad block. The valid block is the block that can store the data. The bad block is the block that cannot be physically used for such a reason that a storage element of the block is broken. In other words, the flash memory module FM0 stores the data only in the valid block and does not store the data in the bad block.

Moreover, the valid block is classified into any one of an unused block, a write-once block and a rewritable block. The unused block is the block that is assigned neither to the write-once block, nor to the rewritable block, having no data stored therein. The write-once block is the block to which the data can be written only once, from which the data cannot be erased and to which the data cannot be rewritten. The rewritable block is the block from which the data can be erased and to which the data can be rewritten.

The block 406 includes a plurality of pages. The page, as will be described later in FIG. 5, is a unit by which the memory controller MC0 reads and writes the data.

The page is classified into any one of a valid page, an invalid page, an unused page and a defective page. The valid page is the page to which valid data is stored. The invalid page is the page to which invalid data is stored. The unused page is the page that does not store data. The defective page is the page that cannot be physically used for such a reason that a storage element of the page is broken.

The interface section 402 is connected through the channel D00 to the storage adapter SA0 inside the storage controller SC. Also, the interface section 402 is connected through the channel D10 to the storage adapter SA1 inside the storage controller SC.

The interface section 402 executes commands from the storage adapters SA0, SA1. The commands from the storage adapters SA0, SA1 is, for example, a SCSI command.

To be specific, the interface section 402 receives data from the storage adapters SA0, SA1. The interface section 402 then stores the received data in the memory 404. Also, the interface section 402 transmits the data stored in the memory 404 to the storage adapters SA0, SA1.

The memory 404 is, for example, a dynamic random access memory and can carry out a reading/writing operation at a high speed. The memory 404 transiently stores the data that is transmitted and received by the interface section 402. The memory 404 also stores the program executed by the processor 401. Also, the memory 404 stores the table which the processor 401 refers to. The table is, for example, a conversion table between the logical address and physical address of the flash memory MEM0.

The data transfer section 403 is, for example, a switch, and connects the processor 401, the interface section 402, the memory 404 and the flash memory MEM0 to one another and controls the data transfer among them.

The processor 401 carries out the various processes by executing the program stored in the memory 404. For example, the processor 401 refers to the conversion table between the logical address of the flash memory and the physical address of the flash memory, and reads and writes the data from and to the flash memory MEM0. Also, the processor 401 carries out the reclamation (or "garbage collection") process and the wear leveling process (process for leveling the number of times of erasing for each block).

The reclamation process is the process for reclaiming an invalid page inside the block 406 to an unused page. Specifically, the processor 401 copies the data stored in the valid page inside the block (target block) 406 targeted for the reclamation process to the unused block. Then, the processor 401 changes a logical block number of the unused block to which the data is copied, to a logical block number of the target block, and erase all of the data in the target block, thereby completing the reclamation process.

For example, when the processor 401 writes the data to the block 406, the number of the unused pages inside the block 406 reduces. When the unused pages inside the block 406 are run out, the processor 401 cannot write the data to the block 406. So, the processor 401 reclaims the invalid page inside the block 406 to the unused page.

Also, the wear leveling process is the process for leveling the number of times of erasing for each of the blocks 406. As a result, the life of the flash memory MEM0 can be extended, because erasing data too many times shortens the useful life of the flash memory MEM0. Generally, the flash memory MEM0 guarantees the data erase of about 100,000 times.

The flash memory modules FM1, FM2 and FM3 have the same configurations as the flash module FM0. Thus, explanations for the flash memory modules FM1, FM2 and FM3 are omitted.

FIG. 5 is an illustration of the block 406 of the flash memory module FM0 in the first embodiment.

The block 406 includes a plurality of pages 501. The block 406 generally includes several tens of pages 501 (for example, 32 pages or 64 pages).

The page 501 is the unit for which the memory controller MC0 or the like reads and writes the data. For example, in a NAND type flash memory, the memory controller MC0 or the like reads the data at a speed of 20 to 30 µs or less/page and writes the data at a speed of 0.2 to 0.3 ms/page. Also, the memory controller MC0 or the like erases the data at a speed of 2 to 4 ms/block.

The page 501 includes a data section 502 and a redundant section 503. The page 501 includes, for example, the data section 502 of 512 bytes and the redundant section 503 of 16 bytes.

The data section 502 stores the normal data.

The redundant section 503 stores a management information and an error correcting code of the page 501.

The management information includes an offset address and a page status. The offset address is the relative address within the block 406 to which the page 501 belongs. Also, the page status indicates to which of the valid page, the invalid page, the unused page and the page being processed the page 501 belongs.

The error correcting code is the information to detect and correct the error in the page 501. It is, for example, Hamming code.

Also, the block 406 has a block management information 520 in a predetermined area. The predetermined area is, for example, the area of a predetermined length from a lead of an address space of the block 406. The block management information 520 includes a logical block number area 510, a valid flag area 511, an erasing count area 512 and a write control information area 513.

The logical block number area 510 stores the logical block number of the block 406. The logical block number is the identifier for the storage controller SC to uniquely identify the block 406.

When the data is moved in the reclamation process or the wear leveling process, the memory controller MC0 or the like stores the value, which is stored in the logical block number area 510 of the block 406 as a movement source, in the logical block number area 510 of the block 406 as a movement destination.

The valid flag area 511 stores to which of the valid block and the bad block the block 406 belongs. The memory controller MC0 or the like, when finding out a defective page, stores a flag indicative of the bad block in the valid flag area 511 of the block 406 including the defective page.

The erasing count area 512 stores the number of times of erasing of data in the block 406. The memory controller MC0 or the like, when erasing the data stored in the block 406, increases the value stored in the erasing count area 512 of the block 406.

The write control information area 513 stores a write control information of the block 406. The write control information indicates an attribute of the block 406.

In this embodiment, the write control information is the two-bit information. Specifically, when the block 406 is the rewritable block, the memory controller MC0 or the like stores '11' in the write control information area 513 of the block 406.

Also, when the block 406 is the incompletely-written write-once block, the memory controller MC0 or the like stores '10' in the write control information area 513 of the block 406. It should be noted that the incompletely-written write-once block is the write-once block including at least one unused page. Therefore, the data may be written to the rest of the pages in the block 406.

Also, when the block 406 is the completely-written write-once block, the memory controller MC0 or the like stores '00' in the write control information area 513 of the block 406. The completely-written write-once block is the write-once block that does not include the unused page. Therefore, the data is stored in all of the pages included in the block 406.

In this embodiment, the memory controller MC0 or the like cannot change the write control information from '10' to '11'. Similarly, the controller cannot change the write control information from '00' to '11'. In other words, the memory controller MC0 or the like cannot change the write-once block to the rewritable block, so the data stored in the write-once block cannot be erased. Thus, the storage system in this embodiment can also store the document that is obliged by law to be stored with write once read many (WORM) attribute.

FIG. 6 shows a configuration of a page management table 600 stored in the memory 404 of the flash memory module FM0 in the first embodiment.

The page management table 600 includes a physical address 601, a logical address 602, and a status 603.

The physical address 601 is the physical address of the page 501 within the flash memory module FM0. It should be noted that the physical address 601 is used when the memory controller MC0 or the like accesses the page 501 inside the flash memory module FM0. Also, the physical address 601 is determined in accordance with the specification of the flash memory chip 405, the configuration of the memory controller MC0 and the like.

The logical address 602 is the logical address of the page 501. The logical address 602 is used when the storage controller SC accesses the page 501 inside the flash memory module FM0. Also, the logical address 602 is determined in accordance with the logical block number of the block to which the page belongs and the offset address of the page 501.

The status 603 indicates to which of the valid page, the invalid page, the unused page, and, the page being processed the page 501 belongs.

The page management table 600 is synchronized with the information stored in the redundant section 503 of the page 501.

FIG. 7 shows a configuration of a block management table 700 stored in the memory 404 of the flash memory module FM0 in the first embodiment.

A block management table 700 includes a physical block number 705, a logical block number 701, a write control information 702, an unused page count 703 and an erasing count 704.

The physical block number 705 is the identifier for the memory controller MC0 or the like to uniquely identify the block 406.

The logical block number 701 is the identifier for the storage controller SC to uniquely identify the block 406. In other words, the logical block number 701 has the same value as that stored in the logical block number area 510 of the block 406. However, when the block 406 is the unused block, the logical block number 701 is indicated by null.

The write control information 702 indicates the attribute of the block 406. Specifically, when the block 406 is the rewritable block, the write control information 702 of the block 406 is indicated by '11'. When the block 406 is the incompletely-written write-once block, the write control information 702 of the block 406 is indicated by '10'. When the block 406 is the completely-written write-once block, the write control information 702 of the block 406 is indicated by '00'. And, when the block 406 is the unused block, the write control information 702 of the block 406 is indicated by null.

In other words, the write control information 702 has the same value as that stored in the write control information area 513 of the block 406.

The erasing count 704 is the number of times of erasing of data in the block 406. The erasing count 704 has the same value as that stored in the erasing count area 512 of the block 406.

The unused page count 703 is the number of the unused pages included in the block 406.

Figure 8:
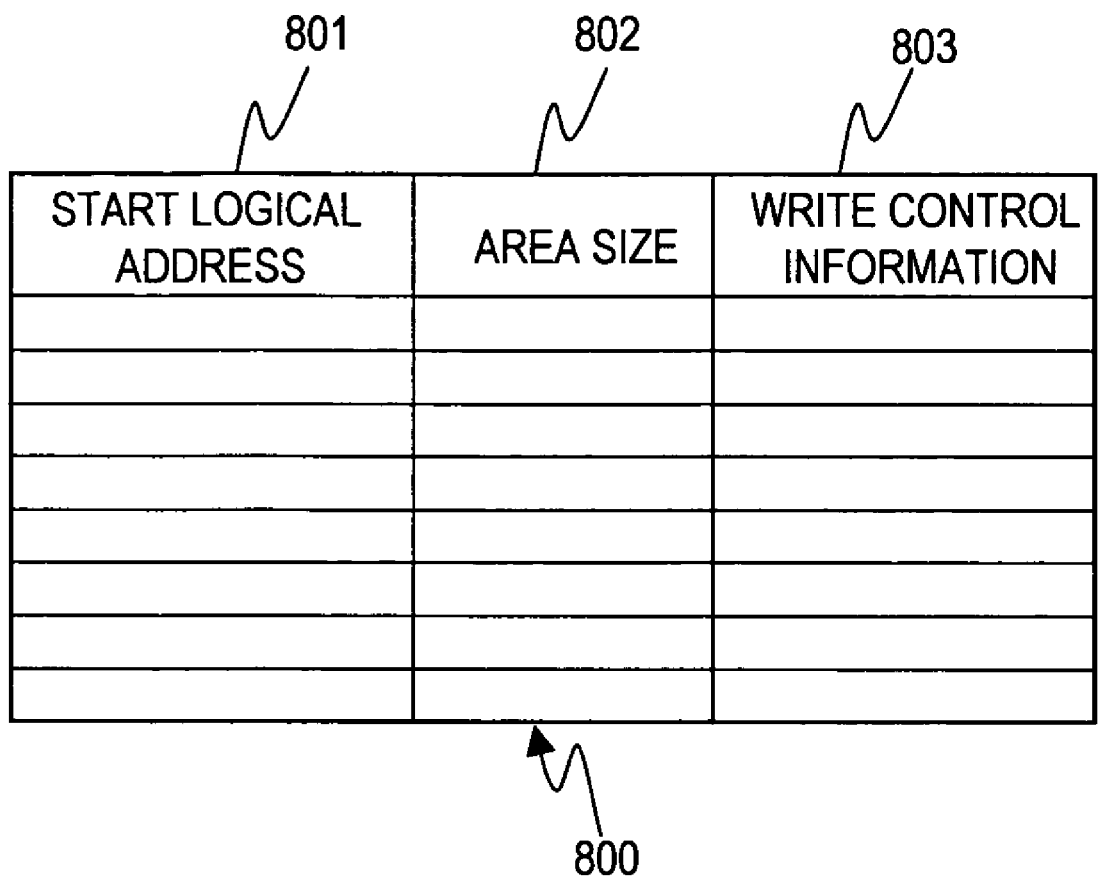
FIG. 8 shows a configuration of an area attribute management table stored in the memory of the flash memory module of the first embodiment.

FIG. 8 shows a configuration of an area attribute management table 800 stored in the memory 404 of the flash memory module FM0 in the first embodiment.

The area attribute management table 800 includes a start logical address 801, an area size 802 and a write control information 803.

The start logical address 801 is a value of a lead of a logical address of a storage area of the flash memory module FM0 or the like.

The area size 802 is the storage capacity of the storage area. In this embodiment, the area size 802 has the multiple of the storage capacity of the block 406 of the flash memory module FM0 or the like. This is because the attribute of the storage area is set at a block unit.

The write control information 803 indicates the attribute of the storage area. Specifically, the write control information 803 indicates the rewritable area or write-once area.

The storage controller SC receives the information with regard to the assignment of the storage area of the flash memory module FM0 or the like, from the maintenance terminal SVP. Next, the controller determines the start logical address of the storage area, the area size and the write control information based on the received information with regard to the assignment. Then, the controller transmits the determined information to the memory controller MC0 and the like.

Then, the memory controller MC0 or the like creates the area attribute management table 800 based on the received information. Specifically, the controller stores the received start logical address in the start logical address 801 of the area attribute management table 800. Next, the controller stores the received area size in the area size 802 of the area attribute management table 800. Next, the controller stores the received write control information in the write control information 803 of the area attribute management table 800.

Next, the controller determines the attribute of the block 406 of the flash memory module FM0 or the like, in accordance with the created area attribute management table 800. Then, the controller creates the page management table 600 of FIG. 6 and the block management table 700 of FIG. 7, in accordance with the created area attribute management table 800 and the determined attribute of the block 406.

Also, the storage controller SC, when the memory controller MC0 or the like is newly connected, transmits an Inquiry command of SCSI to the flash memory module FM0 or the like.

Then, the flash memory module FM0 or the like transmits the response including the content of the area attribute management table 800 to the storage controller SC.

Consequently, the storage controller SC can obtain the area attributes of the newly-connected flash memory module FM0 or the like. In short, the storage controller SC can know to which of the write-once type and the rewritable type the area of newly connected flash memory module FM0 or the like belongs.

Figure 9:
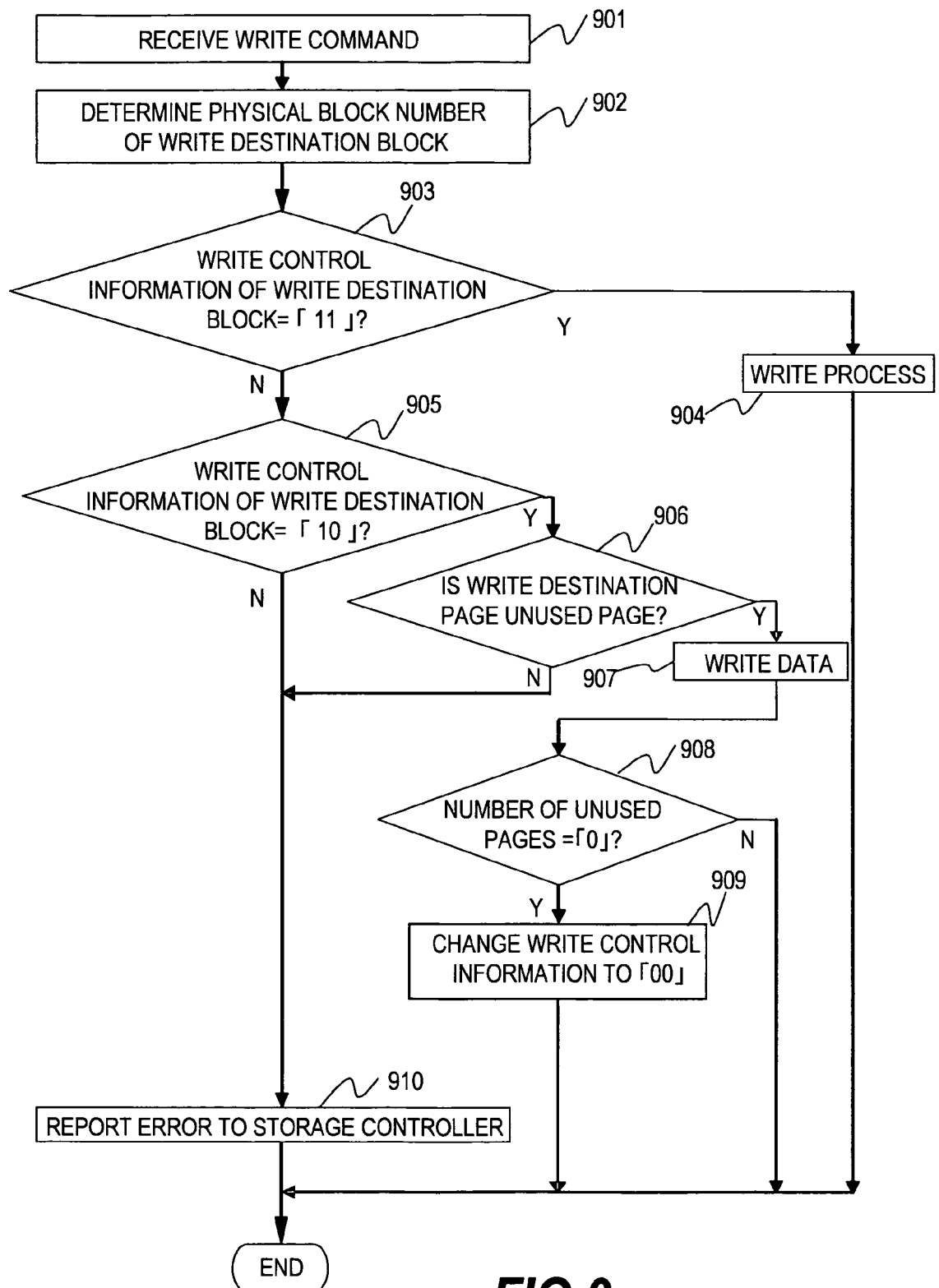
FIG. 9 is a flow chart of a write command execution process of a memory controller of the first embodiment.

FIG. 9 is a flow chart of a write command execution process of the memory controller MC0 or the like in the first embodiment.

At first, the memory controller MC0 or the like receives a write command from the storage controller SC (901). The write command includes the logical address of the page (write destination page) to which the data is written and the date is written.

The memory controller MC0 or the like, when receiving the write command, extracts the logical address from the write command. Next, the controller selects a record where the extracted logical address and the logical address 602 of the page management table 600 are matched, from the page management table 600. Next, the controller extracts the physical address 601 from the selected record.

Next, the physical block number of the block including the page corresponding to the physical address 601 is determined in accordance with the extracted physical address 601 and the configuration of the flash memory module FM0 or the like. Consequently, the physical block number of the write destination block is determined (902).

Next, the record where the determined physical block number and the physical block number 705 of the block management table 700 are matched is selected from the block management table 700. Next, the write control information 702 is extracted from the selected record.

Then, whether or not the extracted write control information 702 is '11' is judged (903).

When the write control information 702 is '11', the write destination block 406 is judged to be the rewritable block. Thus, the write process is performed on the block (904), and this process is ended. The write process will be described later in FIG. 10.

On the other hand, when the write control information 702 is not '11', the write destination block 406 is judged to be write-once block. Then, whether or not the extracted write control information 702 is '10' is judged (905).

When the write control information 702 is not '10', the write destination block is judged to be the completely-written write-once block. Thus, since the data cannot be written to the block, a write error is reported to the storage controller SC (910).

Specifically, the memory controller MC0 or the like sets [SCSI Status=02h:Check Condition] for itself. Then, [Sense Key=07, additional sense code 27h, additional sense code qualifier=00:Write Protected] of an error message is reported to the storage controller SC.

Then, this process is ended.

On the other hand, when the write control information 702 is '10', the block to which the data is written is judged to be the incompletely-written write-once block. So, whether or not the write destination page is the unused page is judged (906).

When the write destination page is not the unused page, the data cannot be written to the page. Thus, the write error is reported to the storage controller SC (910). Then, this process is ended.

On the other hand, when the write destination page is the unused page, the data is written to the page (907).

Next, a record where the physical block number determined at the step 902 and the physical block number 705 of the block management table 700 are matched is selected. Next, the number of the pages to which the date is written is subtracted from an unused page count 703 of the selected record.

Then, whether or not the subtracted value has '0' is judged. Thus, after the write process, whether or not the number of the unused pages included in the block is '0' is judged (908).

When the number of the unused pages does not become '0', the attribute of the block is not required to be changed. Thus, this process is ended in its original state.

On the other hand, when the number of the unused pages becomes '0', the block is judged to be in the write completion. Thus, the value stored in the write control information area 513 of the block is changed to '00'. Moreover, the write control information 702 of the record selected at the step 908 is changed to '00' (909). Then, this process is ended.

Figure 10:
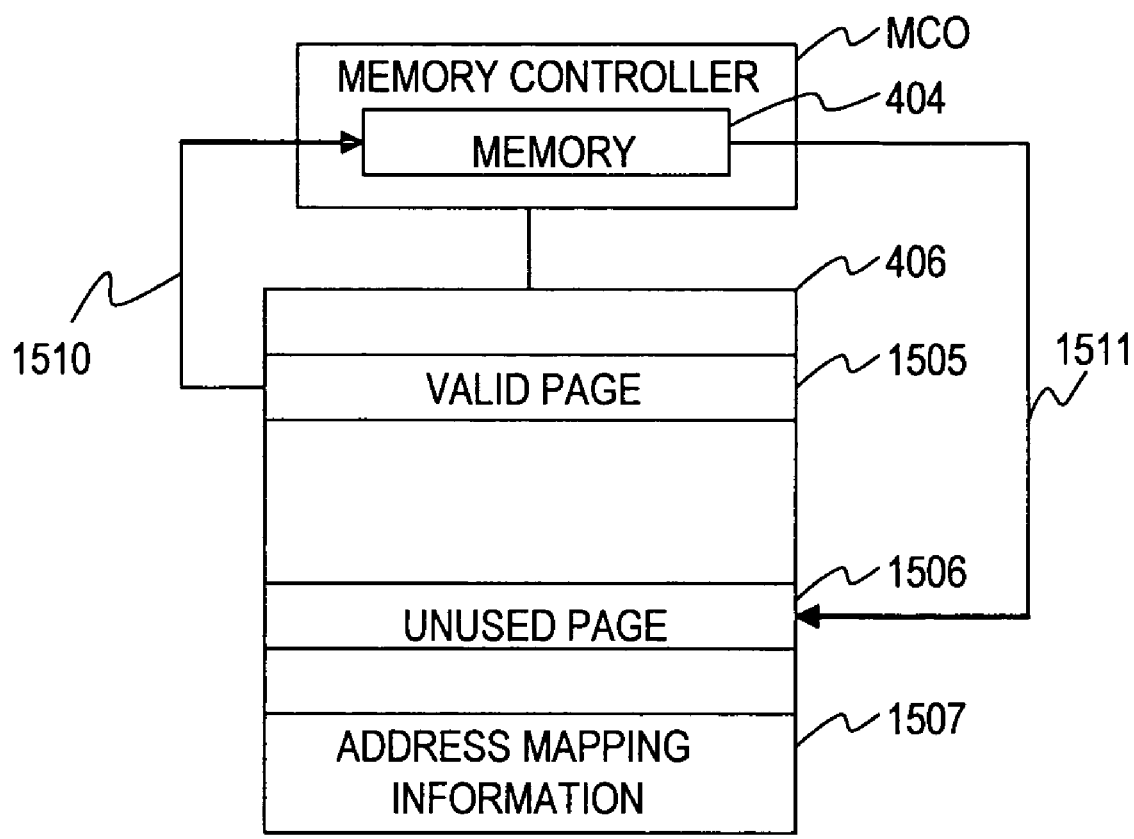
FIG. 10 is a flow chart of a write process of the memory controller of the first embodiment.

FIG. 10 is a flow chart of the write process of the memory controller MC0 or the like in the first embodiment.

Each block 406 inside the flash memory MEM0 and the like has an address mapping information 1507 in a predetermined area. The address mapping information 1507 indicates the correspondence between the logical address and the physical address of the page which the block includes. Specifically, the address mapping information 1507 is corresponding to the logical block number of the block and the offset address of the page.

The write process of the memory controller MC0 or the like will be described below.

At first, the memory controller MC0 or the like judges whether or not the write destination page is the unused page.

When the write destination page is the unused page, the data is written to the page. 'Unused Page' of the page status stored in a redundant section of the page is changed to 'Valid Page' and the page management table 600 is changed similarly. Then, the write process is ended.

On the other hand, when the write destination page is not the unused page, the data cannot be written to the page. Here, the case where the write destination page is a valid page 1505 will be explained.

In this case, the data stored in the valid page 1505 is read and stored in the memory 404 (1510). However, when the whole of the valid page 1505 is rewritten, the data is not required to be read.

Next, the write data is overwritten onto the data stored in the memory 404. Next, the data inside the memory 404 is written to an unused page 1506 included in the block 406 (1511).

Next, the address mapping information 1507 of the block 406 and the page management table 600 of FIG. 6 are changed. Specifically, the mapping information 1507 and the page management table 600 are changed such that the logical address of the unused page 1506 to which the data is written has the value of the logical address of the valid page 1505 from which the data is read. Moreover, the logical address of the valid page 1505 from which the data is read is deleted from the mapping information 1507 and the page management table 600.

Next, 'Valid Page' of a page status stored in a redundant section of the valid page 1505 from which the data is read is changed to 'Invalid Page'. Also, 'Unused Page' of a page status stored in a redundant section of the unused page 1506 is changed to 'Valid Page'.

As mentioned above, the memory controller MC changes the correspondence relation between the logical address and the physical address and consequently writes the data to the flash memory MEM0 or the like. Consequently, the number of times of erasing of data in the flash memory MEM0 or the like can be reduced, thereby writing the data to the flash memory MEM0 or the like at a high speed.

Figure 11:
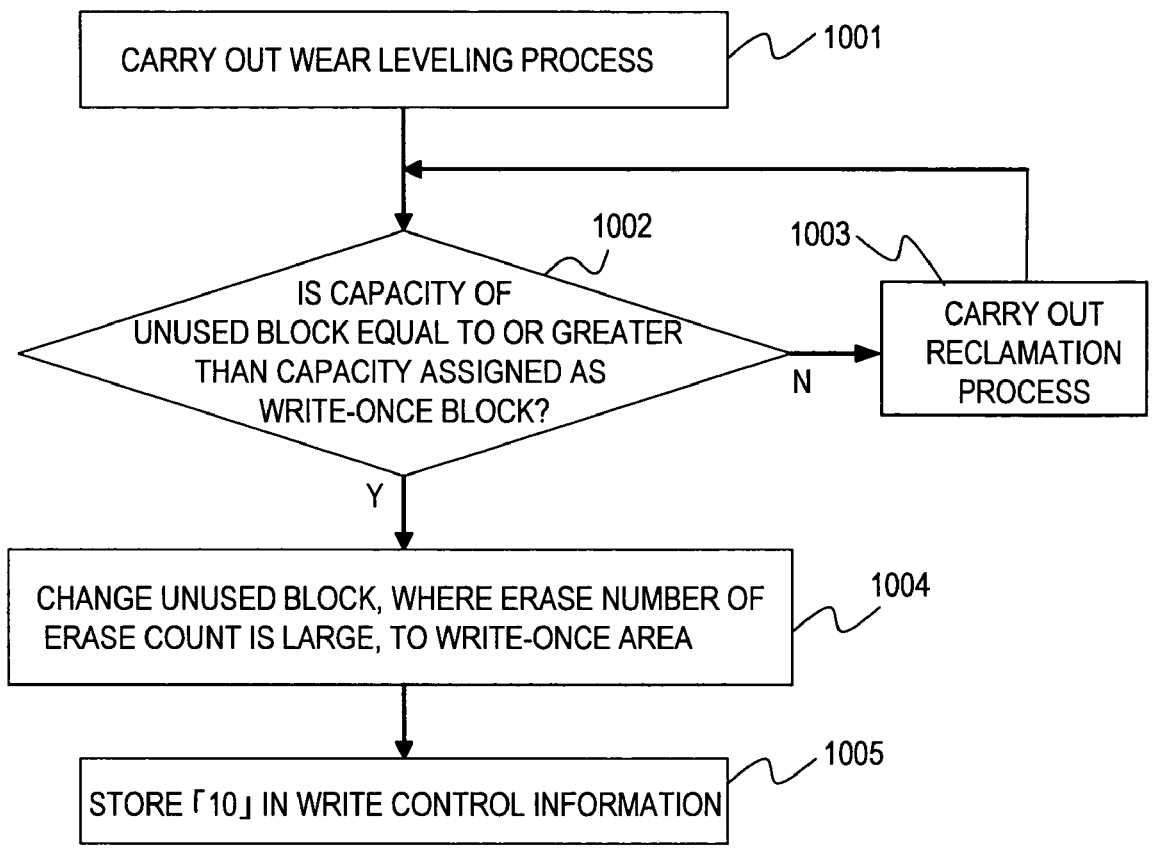
FIG. 11 is a flow chart of an attribute change process of the memory controller of the first embodiment.

FIG. 11 is a flow chart of an attribute change process of the memory controller MC0 or the like in the first embodiment.

At first, the memory controller MC0 or the like receives the assignment request of the write-once block from the storage controller SC. The assignment request of the write-once block includes the storage capacity (request capacity) assigned to the write-once block.

The memory controller MC0 or the like extracts all of the erasing counts 704 from the block management table 700. Next, the controller refers to the extracted erasing counts 704 and performs the wear leveling process (1001). Specifically, the data of the block having a great number of erasing count 704 is moved to the block having a small number of erasing count 704. The memory controller MC0 or the like performs the wear leveling process only on the rewritable block.

Next, the number of the unused blocks is determined by selecting a record where the write control information 702 of the block management table 700 is null. Next, the storage capacity of the unused block is calculated by multiplying the determined number of the unused blocks by the capacity of the unit block. Next, the request capacity is extracted from the received assignment request.

Next, whether or not the calculated the storage capacity of the unused block is equal to or larger than the extracted request capacity is judged (1002).

When the storage capacity of the unused block is smaller than the request capacity, the unused block is lacking, which disables the assignment to the write-once block. So, the reclamation process is performed only on the rewritable block (1003). Consequently, the rewritable block is reclaimed to the unused block (1003). Then, the operational flow returns back to the step 1002.

On the other hand, when the storage capacity of the unused block is equal to or greater than the request capacity, the record where the physical block number of the unused block and the physical block number 701 of the management table 700 are matched is selected. Next, the number of erasing count 704 is selected from the selected record. Next, it is selected in the order starting from the unused block having the great extracted number of erasing count 704. Next, the selected unused block is changed to the write-once block (1004).

Specifically, '10' is stored in the write control information area 513 of the unused block. Moreover, '10' is stored in the write control information 702 of the block management table 700 (1005).

Then, until the storage capacity of the write-once block becomes the request capacity, the unused block is changed to the write-once block, and this process is ended.

It should be noted that the attribute change process is useful when the pre-reserved capacity for the write-once block becomes lacking.

As mentioned above, the memory controller MC0 or the like makes the block having the great erasing count serve as the write-once block. The block having the great erasing count serves as the write-once block where the data is not erased. Thus, it does not reach its life span resulting from the erasing count.

Also, the memory controller MC0 or the like makes the block having the great erasing count serve as the write-once block. Thus, the block having the small erasing count can be used as the rewritable block accompanying the erase of the data.

Also, the memory controller MC0 or the like performs the wear leveling process and the reclamation process only on the rewritable block. In short, the wear leveling process and the reclamation process are not performed on the write-once block. Thus, the data stored in the write-once block is not moved between the blocks. For this reason, the storage system of this invention can prevent the data loss caused by the movement between the blocks of the data stored in the write-once block.

Second Embodiment

In the second embodiment of this invention, after the writing to the rewritable block, the attribute of the block is changed to the write-once block.

The configuration of the storage system in the second embodiment is identical to the storage system in the first embodiment of FIG. 1. Thus, the explanation is omitted.

Figure 12:
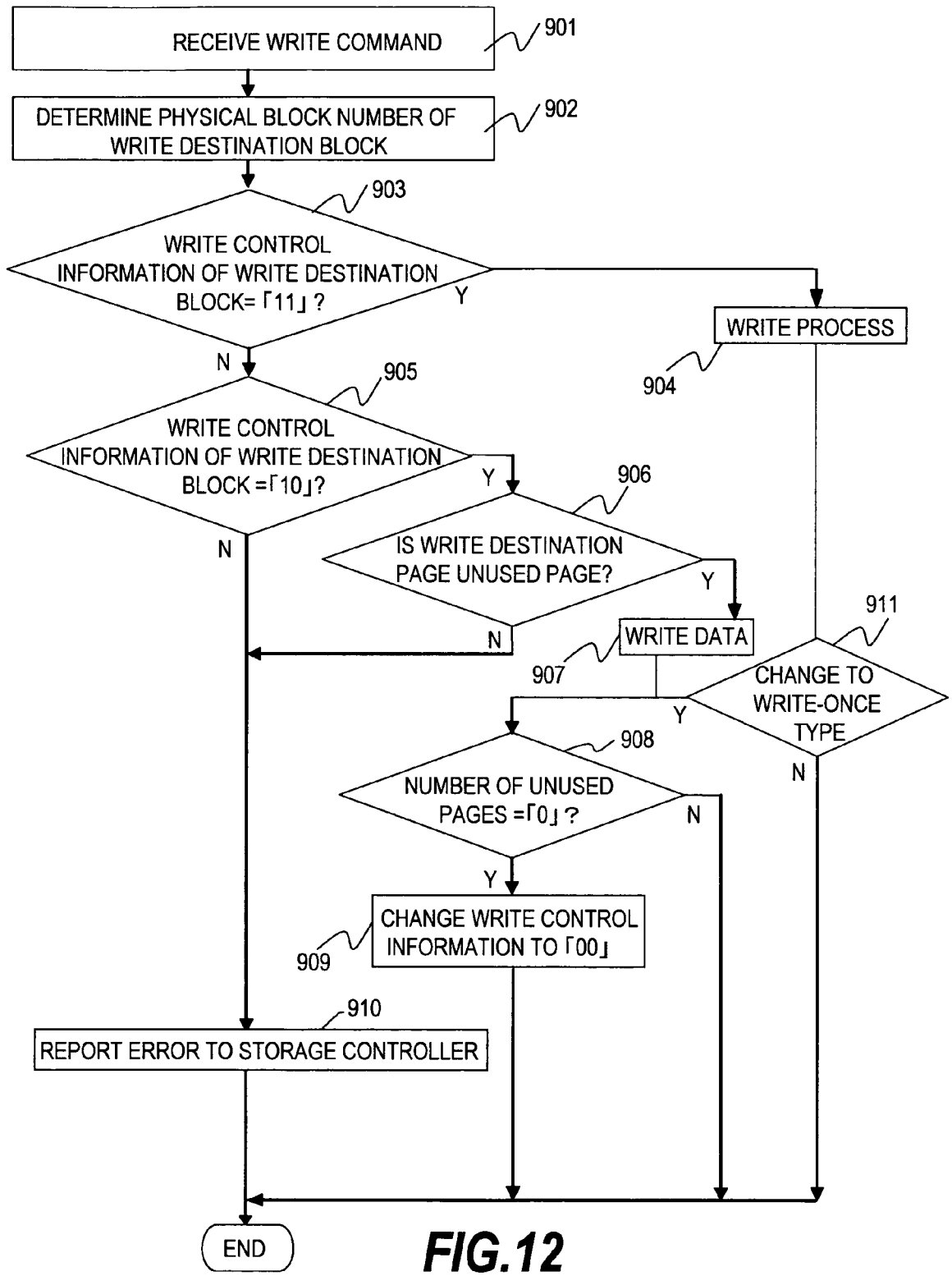
FIG. 12 is a flow chart of a write command execution process of a memory controller of a second embodiment.

FIG. 12 is a flow chart of a write command execution process of the memory controller MC0 or the like in the second embodiment.

A write command execution process in the second embodiment judges whether or not the change to the write-once block is executed after the write process 904. The processes other than it are identical to those of the write command execution process of FIG. 9 in the first embodiment. The same symbols are given to the same processes, and their explanations are omitted.

The memory controller MC0 or the like, when carrying out the write process 904, judges whether or not the write command received at the step 901 includes the change request to the write-once block (911).

When the change request to the write-once block is not included, this process is ended in its original state.

On the other hand, when the change request to the write-once block is included, the rewritable block on which the write process is performed is changed to the write-once block. Specifically, '10' is stored in the write control information area 513 of the block. Moreover, '10' is stored in the write control information 702 of the block management table 700.

Then, the process goes to the step 908. The processes on and after the step 908 are identical to the write command execution process in the first embodiment. Thus, the explanations are omitted.

In the second embodiment, the memory controller MC0 or the like, since changing the attribute of the block after the write process of the data, can easily carry out the process for enlarging the area of the write-once block.

Third Embodiment

In the third embodiment of this invention, the attribute of the block is changed in accordance with the retention period of the data.

Figure 13:
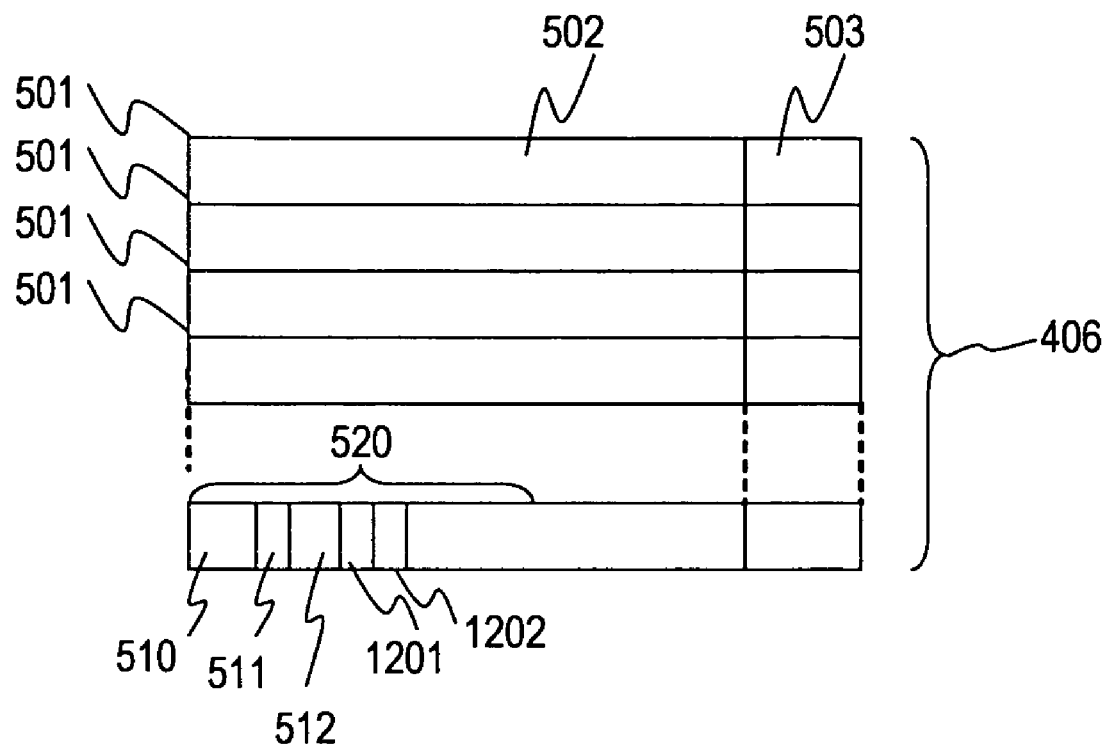
FIG. 13 is an illustration of a block of a flash memory module of a third embodiment.

FIG. 13 is an illustration of the block 406 of the flash memory module FM0 in the third embodiment.

The configuration of the block 406 is identical to the block of FIG. 5 in the first embodiment, except the block management information 520. The same symbols are given to the same configurations, and their explanations are omitted.

The block management information 520 includes a logical block number area 510, a valid flag area 511, an erasing count area 512, a write control information area 1201 and a data retention period information area 1202. The logical block number area 510, the valid flag area 511 and the erasing count area 512 are identical to the configuration of the block of FIG. 5 in the first embodiment. Thus, their explanations are omitted.

The write control information area 1201 stores the write control information of the block 406. The write control information indicates the attribute of the block 406. In this embodiment, the write control information is defined as the three-bits long information.

Specifically, when the block 406 is the rewritable block, the memory controller MC0 or the like stores '111' in the write control information area 1201 of the block 406.

Also, when the block 406 is the incompletely-written write-once block, the memory controller MC0 or the like stores '110' in the write control information area 1201 of the block 406.

When the block 406 stores erasable data after whose retention date has been elapsed and is the completely-written write-once block, the memory controller MC0 or the like stores '000' in the write control information area 1201 of the block 406.

Also, when the block 406 stores inerasable data whose retention date has been elapsed and is the completely-written write-once block, the memory controller MC0 or the like stores '100' in the write control information area 1201 of the block 406.

The data retention period information area 1202 stores the data retention period information of the block 406. The data retention period information is, for example, a data write date, a data retention date or a data retention period. The memory controller MC0 writes the data to the block and writes the retention period information of the data to the block when receiving the write request of the data.

Figure 14:
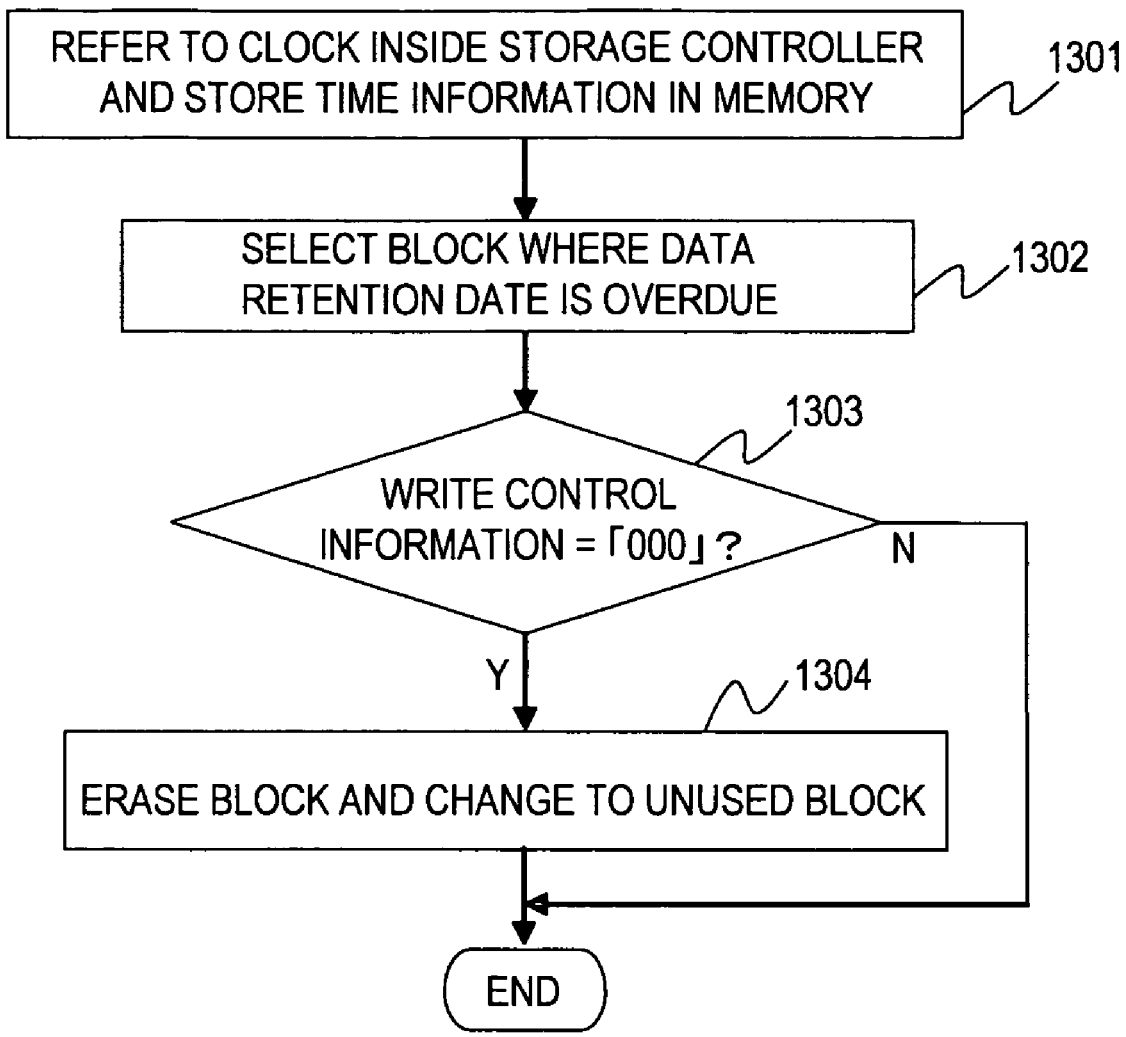
FIG. 14 is a flow chart of a retention date elapse block reclamation process of a memory controller of the third embodiment.

FIG. 14 is a flow chart of a retention date elapse block reclamation process of the memory controller MC0 or the like in the third embodiment.

At first, the memory controller MC0 or the like refers to a clock of the storage controller SC and consequently obtains time information. Next, the obtained time information is stored in the memory 404 (1301). Consequently, each of the flash memory module FM0 and the like is not required to contain the clock.

Next, the data retention period information areas 1202 of all of the blocks 406 included in the flash memory module FM0 and the like are scanned, thereby selecting the block 406 whose data retention date is overdue (1302).

Next, the write control information is extracted from the write control information area 1201 of the selected block 406. Next, whether or not the extracted write control information is '000' is judged (1303).

When the write control information is not '000', the block 406 is judged to store the inerasable data whose retention date has been elapsed. Thus, this process is ended in its original state.

On the other hand, when the write control information is '000', it is judged that the block 406 stores erasable data whose retention date has been elapsed. Thus, the data stored in the block 406 is erased. Then, the block 406 serves as the unused block (1304).

Specifically, the record where the physical block number of the block 406 from which the data is erased and the physical block number 705 of the block management table 700 are matched is selected from the block management table 700. Next, null is stored in the physical block number 701 of the selected record. Next, null is stored in the write control information 702 of the selected record. Next, the number of all of the pages included in the block is stored in the unused page count 703 of the selected record. Next, the number of erasing count 704 of the selected record is increased.

Then, this process is ended.

For example, the memory controller MC0 or the like executes a retention date elapse block reclamation process when the storage system is started. Also, the retention date elapse block reclamation process may be executed about one time per day.

In this embodiment, the memory controller MC0 or the like erases the erasable data from the block 406 after the elapse of the data retention date. Consequently, the storage system can effectively use the storage area.

While the present invention has been described in detail and pictorially in the accompanying drawings, the present invention is not limited to such detail but covers various obvious modifications and equivalent arrangements, which fall within the purview of the appended claims.

What is claimed is:

1. A storage system, comprising:
   a nonvolatile memory which erases data for respective blocks; and
   a controller for inputting and outputting the data to and from the nonvolatile memory,
   wherein the controller assigns at least one of the blocks in the nonvolatile memory as a rewritable area where stored data can be erased, and assigns at least a portion of the rest of the blocks in the non-volatile memory as a write once area where the stored data cannot be erased;
   wherein the controller determines a block belonging to the rewritable area based on an attribute of the block, and performs a wear leveling process and a reclamation process only on the block determined as belonging to the rewritable area,
   wherein the block stores retention period information of the stored data,
   wherein the storage system has a storage area including: the rewritable area where the stored data can be erased; the write-once area where the stored data cannot be erased; and an unused area for which the attribute is not determined; and
   wherein the controller erases data whose retention period expires from the block that stores the data, and changes the write-once area to the unused area by changing the attribute of the block.

2. The storage system according to claim 1, wherein the attribute of the block indicates which of the rewritable area and the write-once area the block belongs to.

3. The storage system according to claim 1, wherein each of the blocks stores the attribute of the block in a predetermined area of the block.

4. The storage system according to claim 1, wherein:
   the block comprises a plurality of pages each being a write unit of the data;
   the write-once area is one of a first write-once area including one or more pages to which no data is written and a second write-once area in that the data is written to all of the pages; and
   the attribute of the block indicates which of the rewritable area, the first write-once area, and the second write-once area the block belongs to.

5. The storage system according to claim 4, wherein the controller reports an error without writing data when receiving a write request of the data to the block belonging to the second write-once area.

6. The storage system according to claim 4, wherein:
   when receiving the write request of data to the block belonging to the first write-once area, the controller determines whether or not data is written to the page based on the attribute of the page to which the data is to be written;
   when data is not written to the page, the controller writes the data to the page and changes the attribute of the block including the page from the attribute indicating the first write-once area to the attribute indicating the second write-once area; and
   when the data is written to the page, the controller reports an error without writing the data.

7. The storage system according to claim 1, wherein the controller writes the data to the block when receiving the write request of the data to the block belonging to the rewritable area, and changes the rewritable area to the write-once area by changing the attribute of the block through a consecutive operation performed with respect to a write command.

8. The storage system according to claim 1, wherein the controller writes the data to the block and writes the retention period information of the data to the block when receiving the write request of the data.

9. The storage system according to claim 1, wherein a write-once flag is set to the block before data is written to the write-once area for which the write-once flag is set.

10. The storage system according to claim 9, wherein the block comprises a plurality of pages each being a write unit of data; and wherein
    before writing data of a write request, the controller determines whether the data is allowed to be written or not, based on a combination of the write-once flag set on a block basis and a page status set on a page basis in synchronism with the data write.

* * * * *